US012720806B2

(12) United States Patent
Fan et al.

(10) Patent No.: US 12,720,806 B2
(45) Date of Patent: Aug. 25, 2026

(54) MEMORY, GATE-ALL-AROUND FIELD-EFFECT TRANSISTOR, AND MANUFACTURING METHOD

(71) Applicant: Huawei Technologies Co., Ltd., Shenzhen (CN)

(72) Inventors: Luming Fan, Shenzhen (CN); Yanxiang Liu, Shanghai (CN); Jeffrey Junhao Xu, Shenzhen (CN); Francis Lionel Benistant, Shenzhen (CN); Zhaozhao Hou, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 419 days.

(21) Appl. No.: 18/350,348

(22) Filed: Jul. 11, 2023

(65) Prior Publication Data

US 2023/0352552 A1 Nov. 2, 2023

Related U.S. Application Data

(63) Continuation of application No. PCT/CN2021/071482, filed on Jan. 13, 2021.

(51) Int. Cl.
*H01L 29/423* (2006.01)
*H01L 29/06* (2006.01)
(Continued)

(52) U.S. Cl.
CPC ....... *H10D 30/6735* (2025.01); *H10D 30/014* (2025.01); *H10D 30/43* (2025.01);
(Continued)

(58) Field of Classification Search
CPC .. H10D 30/6735; H10D 30/014; H10D 30/43; H10D 30/6757; H10D 62/121;
(Continued)

(56) References Cited

U.S. PATENT DOCUMENTS

2014/0264280 A1 9/2014 Kim et al.
2017/0069763 A1* 3/2017 Doris ................ H01L 29/42392
(Continued)

FOREIGN PATENT DOCUMENTS

CN 104115273 A 10/2014
CN 108430911 A 8/2018
(Continued)

OTHER PUBLICATIONS

Collaert,N et al., "A low-voltage biasing scheme for aggressively scaled bulk FinFET 1T-DRAM featuring 10s retention at 85° C.", IMEC, Kapeldreef 75, B-3001 Leuven, Belgium, 2010, 2 pages.
(Continued)

*Primary Examiner* — Tong-Ho Kim
(74) *Attorney, Agent, or Firm* — Conley Rose, P.C.

(57) ABSTRACT

A memory includes a storage array, at least one source line, at least one word line, and at least one bit line. The storage array includes a plurality of gate-all-around field-effect transistors. The at least one word line is connected to gates of the plurality of gate-all-around field-effect transistors. The at least one source line is connected to sources of the plurality of gate-all-around field-effect transistors. The at least one bit line is connected to drains of the plurality of gate-all-around field-effect transistors. A material of a nanowire of the gate-all-around field-effect transistor is silicon germanium (SiGe). For a next-generation logic process (for example, a GAA process), a storage array including a gate-all-around field-effect transistor manufactured by using a same process as a logic process is used in a memory so that the memory can be compatible with the logic process.

20 Claims, 15 Drawing Sheets

(51) Int. Cl.

| | |
|---|---|
| ***H01L 29/66*** | (2006.01) |
| ***H01L 29/775*** | (2006.01) |
| ***H01L 29/786*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.
CPC ....... *H10D 30/6757* (2025.01); *H10D 62/121* (2025.01); *H10D 64/017* (2025.01)

(58) Field of Classification Search
CPC .... H10D 64/017; H10D 30/797; H10D 62/82; H10D 62/822; H10B 12/05; B82Y 10/00
USPC .............................................................. 257/9
See application file for complete search history.

(56) References Cited

U.S. PATENT DOCUMENTS

2017/0263708 A1* 9/2017 Then ................. H01L 21/30604
2020/0035563 A1* 1/2020 Zhang ................ H10D 84/0128
2020/0168715 A1* 5/2020 Wu ................... H01L 21/30604
2020/0381426 A1* 12/2020 Xu ....................... H10D 30/014
2020/0411661 A1* 12/2020 Guler .................. H10D 62/119

FOREIGN PATENT DOCUMENTS

CN 109599335 A 4/2019
CN 110875315 A * 3/2020 ............. H10B 12/30
CN 112151386 A 12/2020

OTHER PUBLICATIONS

Lim,Doohyeok et al., "Nondestructive Readout Memory Characteristics of Silicon Nanowire Biristors", IEEE Transactions on Electron Devices, vol. 65, No. 4, Apr. 2018, 5 pages.
Hoon Jeong et al., "A New Capacitorless 1T DRAM Cell:Surrounding Gate MOSFET With Vertical Channel (SGVC Cell)", IEEE Transactions on Nanotechnology, vol. 6, No. 3, May 2007, 6 pages.
Jerry G et al., "Fundamentals of Ultra-Thin-Body MOSFETs and FinFETs", http://www.cloudioe.com/resources.aspx, 2013, 228 pages.

* cited by examiner

MEMORY, GATE-ALL-AROUND FIELD-EFFECT TRANSISTOR, AND MANUFACTURING METHOD

CROSS-REFERENCE TO RELATED APPLICATIONS

This is a continuation of International Patent Application No. PCT/CN2021/071482 filed on Jan. 13, 2021, the disclosure of which is hereby incorporated by reference in its entirety.

TECHNICAL FIELD

This application relates to the field of semiconductor devices, and in particular, to a memory, a gate-all-around (GAA) field-effect transistor, and a manufacturing method.

BACKGROUND

A dynamic random-access memory (DRAM) is generally used as memory configured to temporarily store data used for operation in a central processing unit (CPU) and data exchanged between the CPU and an external memory, for example, a hard disk.

With scaling of a logic process node for manufacturing a CPU, a field-effect transistor gradually begins to transition from a planar field-effect transistor to a three-dimensional field-effect transistor, for example, a fin field-effect transistor (finFET). However, logic processes are approaching their limits in finFET technology. Currently, as a next-generation logic process technology recognized in the industry, a GAA process gradually matures. Therefore, how to make a memory compatible with a logic process is an urgent problem to be resolved.

SUMMARY

This application provides a memory, a gate-all-around field-effect transistor (GAA FET), and a manufacturing method, to be compatible with a logic process for manufacturing and implement high-capacity storage.

According to a first aspect, this application provides a memory. The memory may be an embedded memory (that is, a memory integrated with a logical device (for example, a processor)), for example, a DRAM or a static random-access memory (SRAM). The memory may include a storage array, at least one source line, at least one word line, and at least one bit line. The storage array includes a plurality of gate-all-around field-effect transistors (GAA FETs). The at least one word line is connected to gates of the plurality of GAA FETs. The at least one source line is connected to sources of the plurality of GAA FETs. The at least one bit line is connected to drains of the plurality of GAA FETs. A material of a nanowire of each GAA FET in the plurality of GAA FETs is silicon germanium (SiGe).

In this application, for a next-generation logic process (for example, GAA), a storage array including a GAA FET manufactured by using a same process as a logic process is used in a memory, so that the process for manufacturing the memory can be compatible with the logic process. Further, the GAA FET has a three-dimensional structure, and therefore high capacity storage of the memory can be implemented.

Further, because a nanowire in the GAA FET is made of SiGe, the GAA FET is more likely to have a band to band tunneling phenomenon. This is more conducive to maintaining and distinguishing a storage status, so as to improve storage performance of the memory.

In some possible implementations, when the GAA FET is cut off, if a first voltage is applied to the bit line, the storage status of the GAA FET is a first state; or if a second voltage is applied to the bit line, the storage status of the GAA FET is a second state. The first state indicates that a hole cluster is formed in a channel of the GAA FET, and the second state indicates that a hole cluster has been removed from a channel of the GAA FET.

During actual application, the GAA FET may be a GAA N-type field-effect transistor, or may be a GAA P-type field-effect transistor.

For example, it is assumed that a reference voltage (for example, 0 volts (V)) is applied to the source line. For a GAA N-type field-effect transistor, when a positive voltage is applied to the word line, the GAA FET is turned on. In this case, the GAA FET is in an on state. When 0 V or a negative voltage is applied to the word line, the GAA FET is cut off. In this case, the GAA FET is in an off state.

For a GAA P-type field-effect transistor, when 0 V or a negative voltage is applied to the word line, the GAA FET is turned on. In this case, the GAA FET is in an on state. When a positive voltage is applied to the word line, the GAA FET is cut off. In this case, the GAA FET is in an off state.

In some possible implementations, when the GAA FET (for example, an N-type GAA FET) is cut off, if a positive voltage (that is, a first voltage) is applied to the bit line, due to a band to band tunneling phenomenon in the GAA FET, electrons are collected by a drain, and a hole cluster is formed in a substrate. In this case, a storage status of the GAA FET is a first state (it may be understood that the first state indicates that a hole cluster is formed in a channel of the GAA FET). Alternatively, if 0 V or a negative voltage (that is, a second voltage) is applied to the bit line, the storage status of the GAA FET is a second state (it may be understood that the second state indicates that a hole cluster has been removed from a channel of the GAA FET).

In some possible implementations, GAA FETs in a same row in the storage array share one word line, and GAA FETs in a same column in the storage array share one bit line.

In some possible implementations, the GAA FET includes: a substrate; an insulation layer formed on the substrate; a nanowire stacked on a side of the insulation layer facing away from the substrate; a gate structure (that is, the gate of the GAA FET) wrapping the nanowire; and an oxide layer formed between the gate structure and the nanowire.

In this application, the oxide layer (which may also be referred to as a gate dielectric layer) is further formed between the gate structure and each nanowire. The oxide layer may isolate a channel from the substrate, and generate a floating body effect, so that a charge is stored in the channel, thereby implementing data storage.

In some possible implementations, the nanowire extends in a first direction and penetrates a source region, a drain region, and a channel region of the GAA FET.

In some possible implementations, a source structure (that is, the source of the GAA FET) is formed in the source region, and a drain structure (that is, the drain of the GAA FET) is formed in the drain region.

In some possible implementations, the GAA FET further includes a plurality of insulation structures, where a first insulation structure in the plurality of insulation structures is disposed between the source region and the channel region, and a second insulation structure in the plurality of insulation structures is disposed between the channel region and the drain region.

In some possible implementations, each insulation structure in the plurality of insulation structures spans the nanowire.

According to a second aspect, this application provides an electronic device. The electronic device may include the memory according to any one of the first aspect and the possible implementations of the first aspect.

In some possible implementations, the electronic device may further include a logic device formed by a GAA FET. The logic device is coupled to the memory.

In this application, because both the logic device and the memory are manufactured by using a GAA process, the process for manufacturing the memory can be compatible with the logic process.

In some possible implementations, the logic device is manufactured by using a logic process (for example, GAA). In this case, the logic device includes a plurality of GAA FETs, and a nanowire in each GAA FETs may be made of a silicon (Si) material. It is different from the material (that is, SiGe) of the nanowire in the GAA FET in the memory. In this way, the logic device has characteristics, for example, low leakage current and low power consumption, while the memory is more likely to have a band to band tunneling phenomenon, and has better storage performance.

Further, a quantity of nanowires of the GAA FET in the logic device may be greater than a quantity of nanowires of the GAA FET in the memory. That is, a quantity of channels in each GAA FET in the logic device is greater than a quantity of channels in each GAA FET in the memory. Alternatively, a quantity of nanowires of the GAA FET in the logic device may be less than a quantity of nanowires of the GAA FET in the memory. That is, a quantity of channels in each GAA FET in the logic device is less than a quantity of channels in each GAA FET in the memory.

It can be understood that for a GAA FET, the fewer channels, the lower power consumption; while the more channels, the higher a read/write speed, and the longer data storage time.

In this application, the electronic device may be an unpackaged die, or may be an electronic component. In addition, the electronic device may alternatively be an integrated circuit product (for example, a system on chip (SOC)). In addition to the memory described in this embodiment of this application, the integrated circuit product may further include a logic device. The logic device is coupled to the memory through, for example, an on-chip high-speed bus interface. In this way, a transmission distance of a read/write data signal within a chip is short, and a system delay is very low.

Further, the logic device and the memory are integrated on a same die, so that the logic device and the memory may be packaged in a same SOC.

According to a third aspect, this application provides a GAAFET, including: a substrate; an insulation layer formed on the substrate; a nanowire stacked on a side of the insulation layer away from the substrate, where a material of the nanowire is SiGe; a gate structure (that is, a gate of the GAA FET) wrapping the nanowire; and an oxide layer formed between the gate structure and the nanowire.

In some possible implementations, the nanowire extends in a first direction and penetrates a source region, a drain region, and a channel region of the GAA FET.

In some possible implementations, a source structure (that is, a source of the GAA FET) is formed in the source region, and a drain structure (that is, a drain of the GAA FET) is formed in the drain region.

In some possible implementations, the GAA FET further includes a plurality of insulation structures, where a first insulation structure in the plurality of insulation structures is disposed between the source region and the channel region, and a second insulation structure in the plurality of insulation structures is disposed between the channel region and the drain region.

In some possible implementations, each insulation structure in the plurality of insulation structures spans the nanowire.

According to a fourth aspect, this application provides a method for manufacturing a GAA FET. The method is used to manufacture the GAA FET according to the third aspect. The method includes: providing a substrate, and depositing a first insulation material is deposited on the substrate, to form an insulation layer; alternately depositing a first semiconductor material and a second semiconductor material on the insulation layer, where the first semiconductor material is Si, and the second semiconductor material is SiGe; etching the first semiconductor material to form a plurality of nanowires; and forming a gate structure (that is, a gate of the GAA FET) on the nanowires, where the gate structure wraps at least one nanowire.

In some possible implementations, the method further includes: depositing a second insulation material on the substrate and the nanowire; and etching the second insulation material to form a plurality of insulation structures that are separate from each other, where each insulation structure in the plurality of insulation structures spans the nanowire to separate the nanowire into a plurality of portions.

In some possible implementations, the plurality of insulation structures include two oppositely disposed insulation structures. The forming a gate structure on the nanowires includes: depositing a gate material between the two oppositely disposed insulation structures to form the gate structure.

It should be understood that the technical solutions in the second aspect to the fourth aspect of this application are consistent with the technical solution in the first aspect of this application. Beneficial effects achieved in the various aspects and corresponding feasible implementations are similar, and details are not described again.

BRIEF DESCRIPTION OF DRAWINGS

To describe technical solutions in embodiments of this application more clearly, the following describes the accompanying drawings used in embodiments of this application.

DESCRIPTION OF EMBODIMENTS

The following clearly and completely describes the technical solutions in the embodiments of this application with reference to the accompanying drawings in the embodiments of this application. The described embodiments are some but not all of the embodiments of this application. All other embodiments obtained by a person of ordinary skill in the art based on the embodiments of this application without creative efforts shall fall within the protection scope of this application.

References to "first", "second" and similar terms herein do not imply any order, quantity or importance, but are merely intended to distinguish between different components. Similarly, similar words such as "a" or "an" do not imply a quantitative limit, but rather the existence of at least one.

In embodiments of this application, the terms such as "example" or "for example" are used to represent an example, an illustration, or a description. Any embodiment or design scheme described as an "example" or "for example" in embodiments of this application should not be explained as being more preferred or having more advantages than another embodiment or design scheme. Exactly, use of the terms such as "example" or "for example" is intended to present a relative concept in a specific manner. In the descriptions of embodiments of this application, unless specified otherwise, "a plurality of" refers to two or more than two. For example, a plurality of GAA FETs refers to two or more than two GAA FETs.

First, several concepts in embodiments of this application are explained.

Floating body effect refers to a transistor made of Si placed on an insulator. The transistor forms a capacitor on the insulating substrate and charges accumulate on the capacitor.

Band to band tunneling refers to a phenomenon that an electron that does not have enough energy to transition from a valence band to a conduction band can tunnel directly from the valence band to the conduction band, also known as Zener breakdown.

Figure 1:
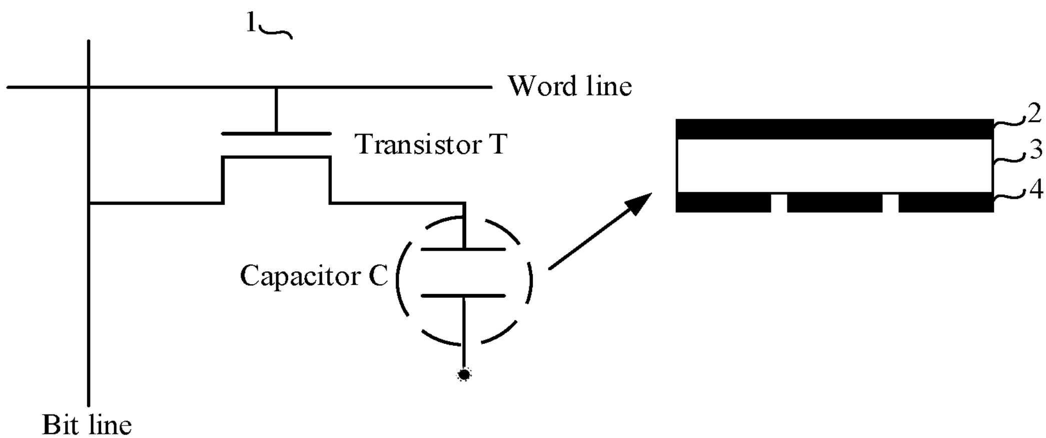
FIG. 1 is a circuit diagram corresponding to a storage unit according to an embodiment of this application.

A DRAM works by charging and discharging a capacitor to read and write data. Each storage unit in the DRAM is configured to store one bit of data. FIG. 1 is a circuit diagram corresponding to a storage unit according to an embodiment of this application. Referring to FIG. 1, a single storage unit 1 may be formed by a transistor T (transistor) and a capacitor C (capacity), that is, has a 1T1C structure. The transistor T is configured to control conduction of a circuit. The capacitor C is configured to store a charge, and the capacitor C is disposed between the transistor T and a metal connection line. Generally, the storage unit has a cylindrical structure.

Still referring to FIG. 1, in the storage unit 1, the capacitor C generally includes a first plate 2, a second plate 3, and an insulation layer 4 disposed between the first plate and the second plate. Materials of the first electrode plate 2 and the second electrode plate 3 are commonly a metal. A material of the insulation layer 4 is generally an insulation material having a high dielectric constant, for example, lanthanum oxide (LaO), aluminum oxide (AlO), zirconium oxide (ZrO), titanium oxide (TiO), and silicon oxide (SiO). The insulation layer 4 is also a charge storage layer.

In some possible embodiments, a logic process for manufacturing a CPU is different from a logic process for manufacturing a DRAM. The DRAM is usually disposed on a die different from that of the CPU, to serve as an external memory of the CPU. As a result, a speed of data exchange between the DRAM and the CPU is limited.

To resolve the foregoing problem, an embodiment of this application provides an embedded DRAM (eDRAM). The embedded DRAM and a CPU are integrated on a same die, so that a speed of data exchange between the DRAM and the CPU is greatly improved.

Figure 2:
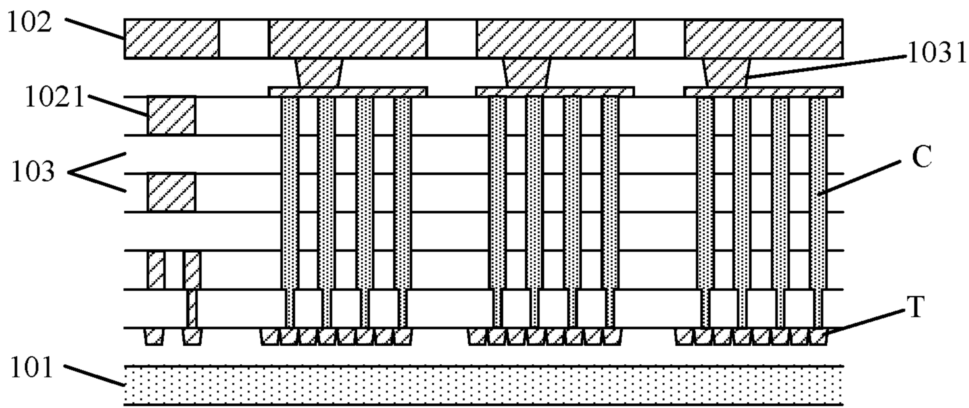
FIG. 2 is a schematic diagram of a structure of a single storage unit according to an embodiment of this application.

In some possible implementations, the embedded DRAM may be manufactured by using a logic process by which the CPU is manufactured, so as to be compatible with the logic process. For example, for a storage unit, FIG. 2 is a schematic diagram of a structure of a single storage unit according to an embodiment of this application. Refer to FIG. 2. First, a transistor T is manufactured on a substrate 101, and then at least one metal layer 102 is manufactured. The transistor T and the metal layer 102 and adjacent metal layers are separated by an insulation layer 103. When manufacturing the metal layer 102, a via 1031 on the insulation layer 103 and a via 1021 on the metal layer are superimposed to form a via corresponding to a capacitor C. An insulation layer material and upper and lower plate materials are deposited inside the via corresponding to the capacitor C, to form the capacitor C in the 1T1C structure. The capacitor C and the transistor T are electrically connected to form a single storage unit of 1T1C.

In an actual manufacturing process, the capacitor in the storage unit is formed by stacking vias in a plurality of insulation layers and vias in metal interconnection layers. The vias in each insulation layer and the vias in each metal interconnection layer need to be manufactured by using a photolithography process. However, when manufacturing a via, because there is an alignment deviation on a lithography machine, a plurality of stacked vias need to perform multiple alignments, and the multiple alignments may cause an accumulated deviation. It requires a size of a formed capacitor to be large, to ensure that the vias in the plurality of insulation layers are aligned with the vias in the plurality of metal interconnection layers. However, with continuous scaling of a process node of a CPU and continuous improvement of storage capacity density, a size of a single capacitor becomes smaller, and some capacitors are even only dozens of nanometers. In this case, it cannot be ensured that the vias in the plurality of insulation layers are aligned with the vias in the plurality of metal interconnection layers. Therefore, the embedded DRAM cannot be manufactured by using a logic process for manufacturing the CPU, and further, the embedded DRAM cannot be compatible with the process for manufacturing the CPU.

Figure 3:
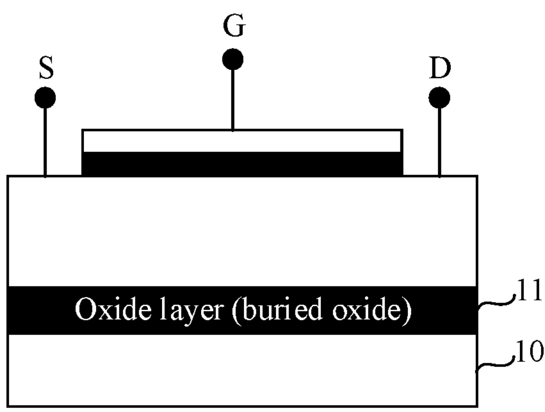
FIG. 3 is a schematic diagram of a structure of a capacitorless DRAM according to an embodiment of this application.
Figures 4A, 4B, 4C, 4D:
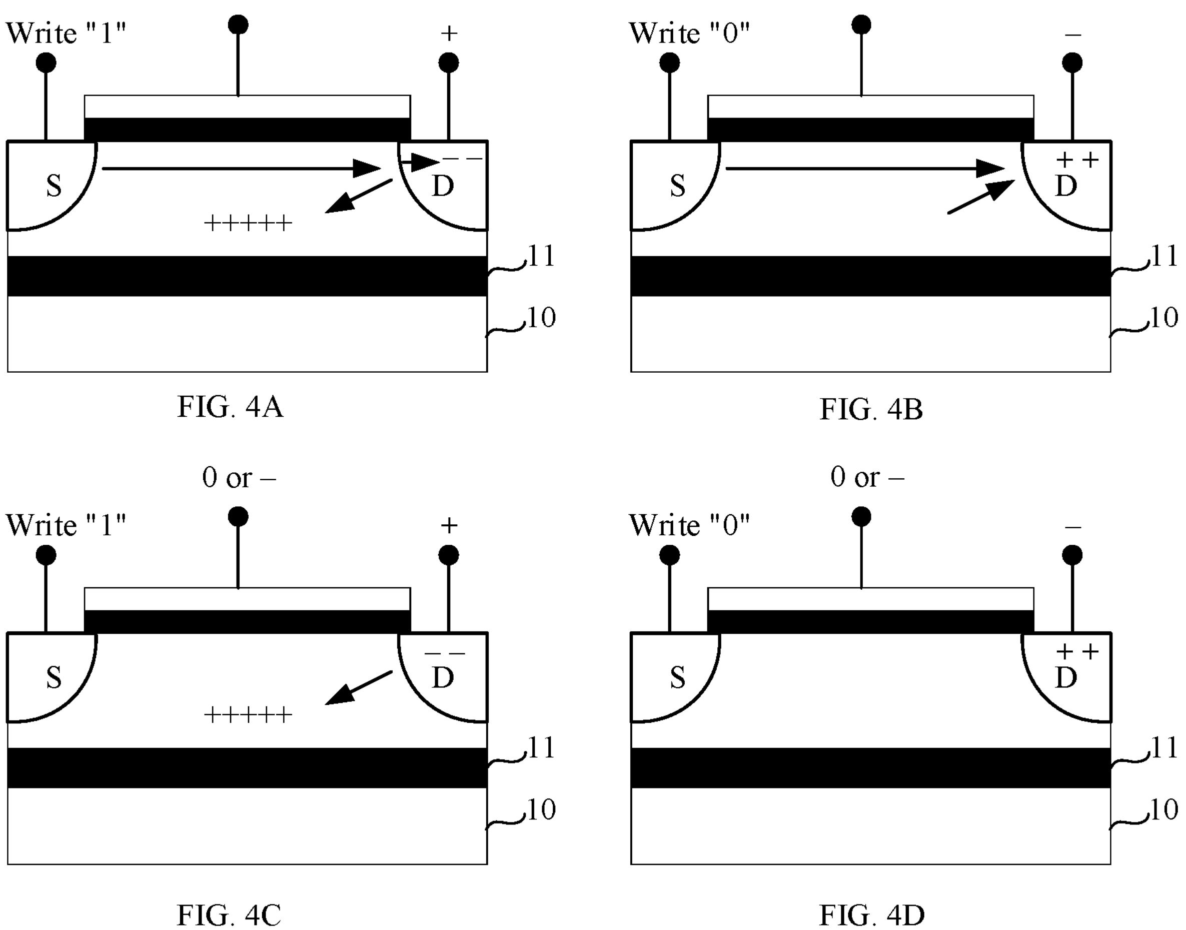
FIGS. 4A-4D are schematic diagrams of a storage status of a capacitorless DRAM according to an embodiment of this application.

Further, to avoid incompatibility between processes for manufacturing an embedded DRAM and a CPU due to a size of a capacitor, an embodiment of this application provides a capacitorless DRAM. FIG. 3 is a schematic diagram of a structure of a capacitorless DRAM according to an embodiment of this application. Referring to FIG. 3, a capacitorless DRAM is formed by silicon 11 on an insulating substrate 10 (silicon on insulator, SOI). A transistor (an NMOS is used as an example) is manufactured on the SOI. In this case, the transistor forms a capacitor (that is, floating body effect) on the insulating substrate 10. Different voltages are applied to a source S, a drain D, and a gate G, and impact ionization or band to band tunneling occurs near the drain D. Then, a charge is stored or released through a channel of the transistor. In this way, a function of reading and writing data is implemented. For example, FIGS. 4A-4D are schematic diagrams of a storage status of a capacitorless DRAM according to an embodiment of this application. Referring to FIG. 4A, when a positive voltage is applied to the gate G and a positive voltage is applied to the drain D, impact ionization occurs near the drain D, a hole cluster is formed, and “1” is written to the transistor. As shown in FIG. 4B, when a positive voltage is applied to the gate G and a positive voltage is applied to the drain D, the hole cluster near the drain D is removed, and “0” is written to the transistor. As shown in FIG. 4C, band to band tunneling occurs near the drain D of the transistor, and a hole cluster is formed. When 0 V or a negative voltage is applied to the gate G and a positive voltage is applied to the drain D, “1” is written to the transistor. As shown in FIG. 4D, when 0 V or a negative voltage is applied to the gate G and a negative voltage is applied to the drain D, the hole cluster near the drain D is removed, and “0” is written to the transistor.

The substrate is used to store the charge. In this case, there is a leakage current, and charge retention time is limited. Therefore, the capacitorless DRAM needs to be refreshed periodically to retain the charge. However, a SOI is costly, and the process for manufacturing the capacitorless DRAM cannot be industrialized.

From above, how to make an embedded DRAM compatible with a logic process is an urgent problem to be solved.

To resolve the foregoing problem, an embodiment of this application provides a memory. The memory may be an embedded DRAM, or may be an SRAM, or the like. The memory and a logical device (for example, a processor) may be integrated in a same die, to implement high-speed data exchange between the memory and the logical device.

Figure 5:
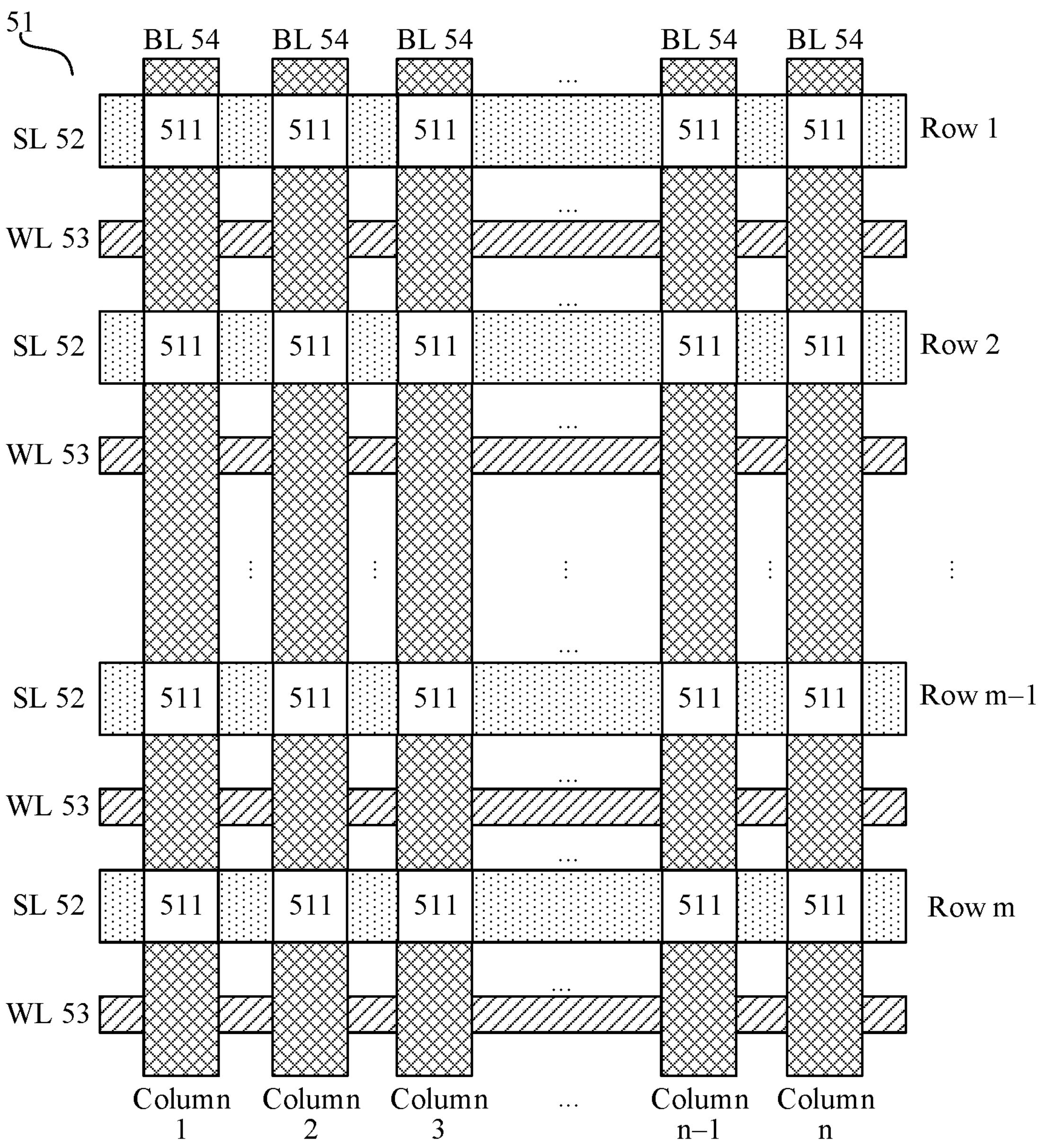
FIG. 5 is a schematic diagram of a structure of a memory according to an embodiment of this application.

FIG. 5 is a schematic diagram of a structure of a memory according to an embodiment of this application. Referring to FIG. 5, the memory may include a storage array 51, at least one source line (SL) 52, at least one word line (WL) 53, and at least one bit line (BL) 54. The storage array 51 includes a plurality of GAA FETs 511. One GAA FET 511 may be understood as one storage unit in the storage array 51, and is configured to store one-bit data. The plurality of GAA FETs 511 may form an m×n storage array, where m and n are positive integers.

Optionally, the at least one word line 53 may be connected to gates of the plurality of GAA FETs 511, the at least one source line 52 may be connected to sources of the plurality of GAA FETs 511, and the at least one bit line 54 may be connected to drains of the plurality of GAA FETs 511. Further, in the storage array 51, GAA FETs 511 located in a same row share one word line 53, and GAA FETs 51 located in a same column share one bit line 54.

During actual application, the GAA FET may be a GAA N-type field-effect transistor, or may be a GAA P-type field-effect transistor.

For example, it is assumed that a reference voltage (for example, 0 V) is applied to the source line. For a GAA N-type field-effect transistor, when a positive voltage is applied to the word line 53, the GAA field-effect 511 transistor is turned on. In this case, the GAA FET 511 is in an on state. When 0 V or a negative voltage is applied to the word line 53, the GAA FET 511 is cut off. In this case, the GAA FET 511 is in an off state.

For a GAA P-type field-effect transistor, when 0 V or a negative voltage is applied to the word line 53, the GAA FET 511 is turned on. In this case, the GAA FET 511 is in an on state. When a positive voltage is applied to the word line 53, the GAA FET 511 is cut off. In this case, the GAA FET 511 is in an off state.

In some possible implementations, when the GAA FET 511 (for example, an N-type GAA FET) is cut off, if a positive voltage (that is, a first voltage) is applied to the bit line 54, due to a band to band tunneling phenomenon in the GAA FET 511, electrons are collected by a drain, and a hole cluster is formed in a substrate. In this case, a storage status of the GAA FET 511 is a first state (it may be understood that the first state indicates that a hole cluster is formed in a channel of the GAA FET 511). Alternatively, if 0 V or a negative voltage (that is, a second voltage) is applied to the bit line 54, the storage status of the GAA FET 511 is a second state (it may be understood that the second state indicates that a hole cluster has been removed from a channel of the GAA FET 511).

During actual application, to determine the storage status of the GAA FET 511, the source line 52 may be set to 0 V, and a positive voltage may be applied to the word line 53 and the bit line 54. In addition, a voltage difference between the word line 53 and the bit line 54 is greater than an on-voltage threshold of the GAA FET 511. In this case, the GAA FET 511 is turned on, and there is a current at the drain of the GAA FET 511. When the GAA FET 511 is in a state “1”, an on-voltage of the GAA FET 511 decreases because holes reduce a barrier height of the channel. Therefore, a drain current in this case is greater than a drain current when the GAA FET 511 is in a state “0”. In this way, the storage status can be distinguished based on a magnitude of the drain current.

In this embodiment of this application, for a next-generation logic process (for example, GAA), a storage array including a GAA FET manufactured by using a same process as a logic process is used in a memory, so that the memory can be compatible with the logic process. Further, the GAA FET has a three-dimensional structure, and therefore high capacity storage of the memory can be implemented.

A specific structure of the GAA FET is described below.

Figure 6:
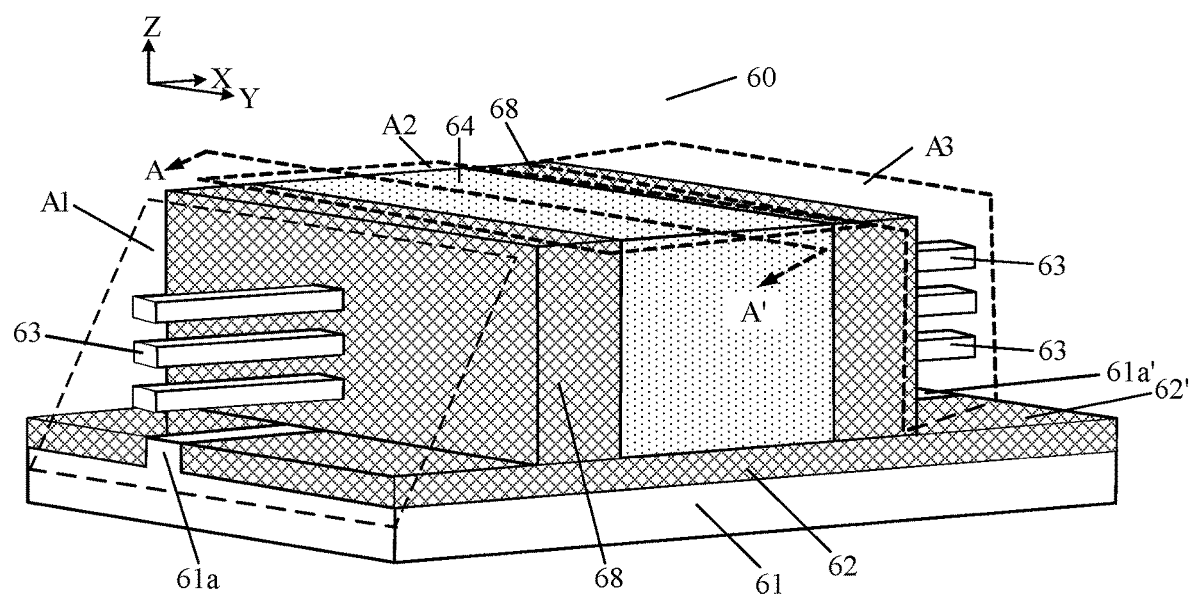
FIG. 6 is a schematic diagram of a structure of a GAAFET according to an embodiment of this application.

FIG. 6 is a schematic diagram of a structure of a GAAFET according to an embodiment of this application. Referring to FIG. 6, a GAA FET 60 includes: a substrate 61, an insulation layer 62, a plurality of nanowires 63 disposed in a stacked manner, a gate structure 64 (that is, a gate of the GAAFET) wrapping the nanowire 63, and an oxide layer 65 formed between the gate structure 64 and the nanowire 63.

Figure 7:
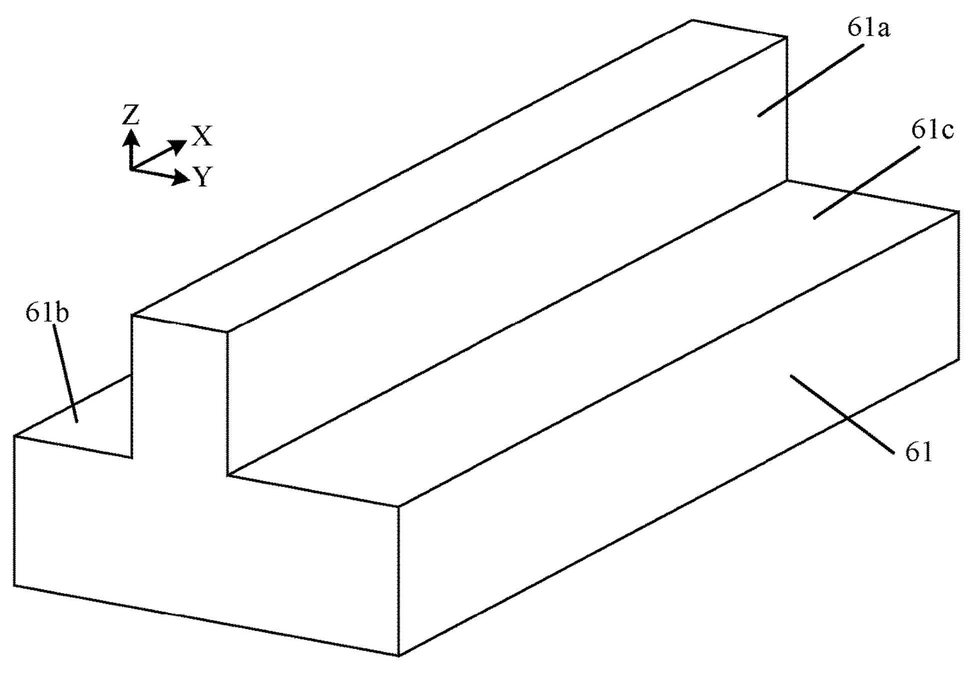
FIG. 7 is a schematic diagram of a substrate according to an embodiment of this application.

FIG. 7 is a schematic diagram of a substrate according to an embodiment of this application. Referring to FIG. 7, a semiconductor protrusion 61*a* is formed by etching a substrate 61, and an upper surface of the substrate 61 is separated by the semiconductor protrusion 61*a* into a plurality of portions that are not connected to each other, for example, a portion 61*b* and a portion 61*c*.

For example, a semiconductor material usually used in the substrate 61 may specifically include but is not limited to: Si, gallium nitride (GaN), gallium arsenide (GaAs), aluminum nitride (AlN), silicon carbide (SiC), indium phosphide (InP), zinc selenide (ZnSe) or another Group VI, Group III-V or Group II-VI semiconductor material.

It should be noted that in this embodiment of this application, it is assumed that a length direction of the semiconductor protrusion 61*a* is denoted as a first direction X, a width direction is denoted as a second direction Y, and a height direction is denoted as a third direction Z.

Figure 8:
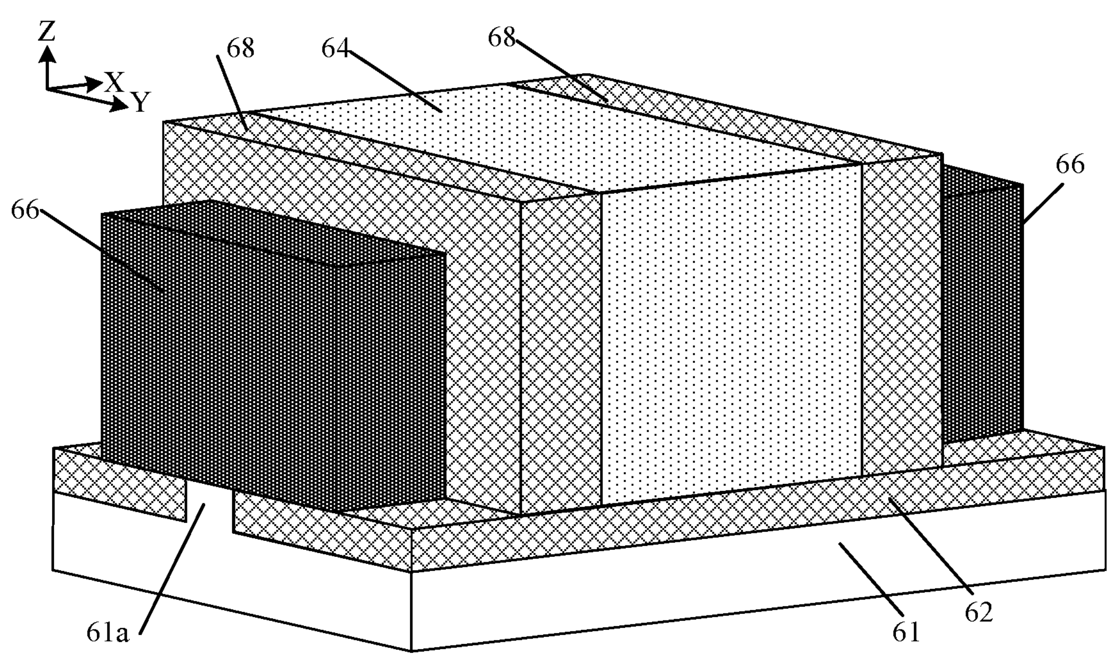
FIG. 8 is a schematic diagram of a semiconductor structure grown in a GAA FET according to an embodiment of this application.
Figure 9:
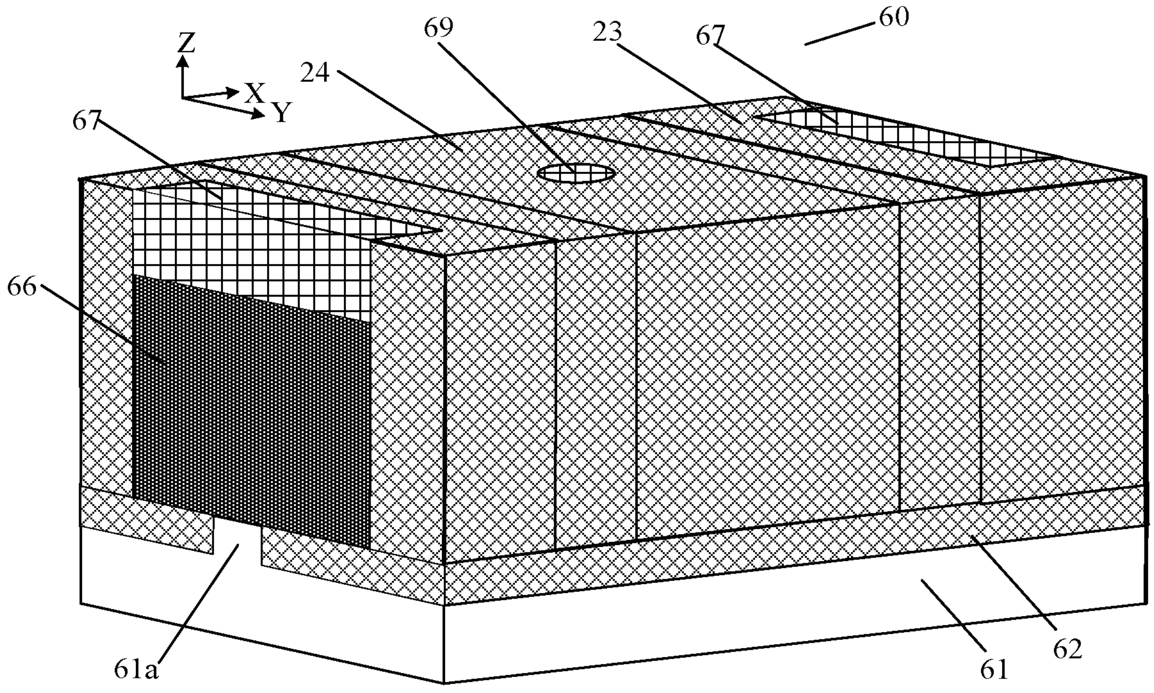
FIG. 9 is a schematic diagram of an overall structure of a GAA FET according to an embodiment of this application.

In some possible embodiments, still referring to FIG. 6, the semiconductor protrusion 61*a* penetrates a source region A1, a channel region A2, and a drain region A3 of the GAA FET 60. The source region A1 and the drain region A3 may be regions on the substrate 61 that form a semiconductor structure 66 as shown in FIG. 8. The semiconductor structure 66 has a dopant therein. A source structure (that is, a source of a GAA FET) or a drain structure (that is, a drain of a GAA FET) are formed in the source region A1 and the drain region A3 respectively. In addition, a contact metal 67 such as that shown in FIG. 9 is generally formed in the source region A1 and the drain region A3, and the contact metal 67 is used to lead out the source or the drain. For materials, shapes, and the like of the semiconductor structure 66 and the contact metal 67, refer to specific descriptions in the following. The channel region A2 is located between the source region A1 and the drain region A3, and may be a region where a gate material is deposited to form a gate structure 64.

Figure 10:
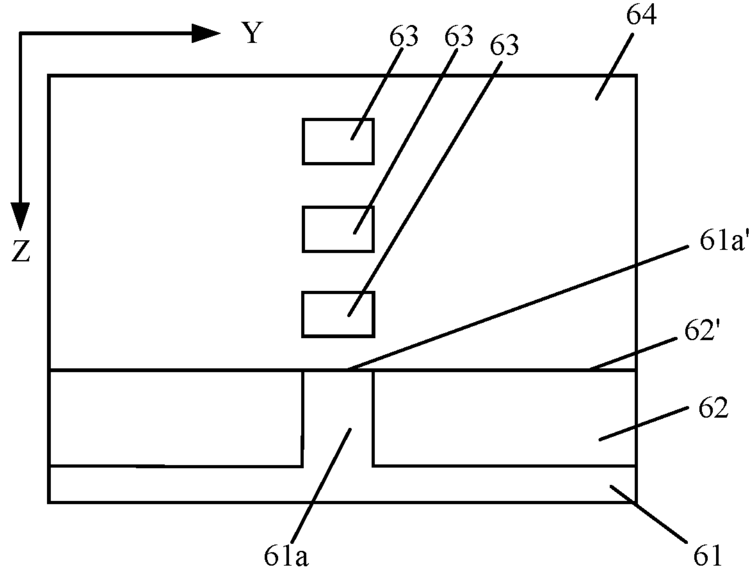
FIG. 10 is a cross-sectional view of a GAA FET according to an embodiment of this application.

An insulation layer 62 is deposited on the upper surface of the substrate 61, that is, on the portions 61*b* and 61*c* shown in FIG. 7, to form shallow trench isolation. A material of the insulation layer 62 includes but is not limited to: silicon oxide, sapphire, or any combination thereof. A thickness h1 of the insulation layer 62 in the third direction Z may be equal to a height h2 of the semiconductor protrusion 61*a* protruding outward from the substrate 61. Refer to FIG. 10. FIG. 10 is a cross-sectional view of a GAA FET 60 cut along AA' shown in FIG. 6 according to an embodiment of this application. In the third direction Z, a surface 61*a*' on a side of the semiconductor protrusion 61*a* away from the substrate 61 is flush with a surface 62' on a side of the insulation layer 62 away from the substrate 61 (that is, their heights are equal).

Still referring to FIG. 6, the plurality of nanowires 63 disposed in a stacked manner do not contact each other, and there is a spacing between two adjacent nanowires 63. These nanowires 63 may be disposed on the side of the semiconductor protrusion 61*a* away from the substrate 61 and are not in contact with the semiconductor protrusion 61*a* and the substrate 61. A material of each nanowire 63 may be the same as that of which the substrate 61 is formed. Each nanowire 63 extends in the first direction X and penetrates the source region A1, the channel region A2, and the drain region A3 of the GAA FET 60.

For example, the spacing between every two nanowires 63 may be 11 nanometer (nm). In this case, a thickness of each nanowire 63 in the third direction Z may be 7 nm. In a specific process practice, to ensure a stress of the nanowire 63 located in the source region A1 and the drain region A3 to grow a source semiconductor material and a drain semiconductor material, a thickness in the third direction Z of a portion of the nanowire 63 located in the channel region A2 can be reduced after a semiconductor material is epitaxially grown in a portion of the nanowire 63 located in the source region A1 and a portion of the nanowire 63 located in the drain region A3. In this way, a distance between every two nanowires 63 in the channel region can be increased. For example, the thickness in the third direction Z of the portion of the nanowire 63 located in the channel region A2 may be reduced to 4 nm. Certainly, embodiments of this application is not limited thereto, and are determined based on an actual product requirement. For example, the thickness in the third direction Z of the portion of the nanowire 63 located in the channel region A2 may be alternatively reduced to 5 nm or 6 nm. In this case, the distance between every two nanowires 63 located in the channel region A2 may be 13 nm or 12 nm.

It should be noted that in an actual product, for example, the GAA FET 60 shown in FIG. 6, the source structure and the drain structure (for example, the semiconductor structure 66 shown in FIG. 8) are grown in the portion of the nanowire 63 located in the source region A1 and the portion of the nanowire 63 located in the drain region A3 respectively. To better illustrate structures such as the nanowire 63 and the gate structure 64, the source structure and the drain structure grown on the nanowire 63 are not shown in FIG. 6.

In some possible embodiments, the nanowire 63 may be alternatively replaced with a nanosheet.

Figure 11:
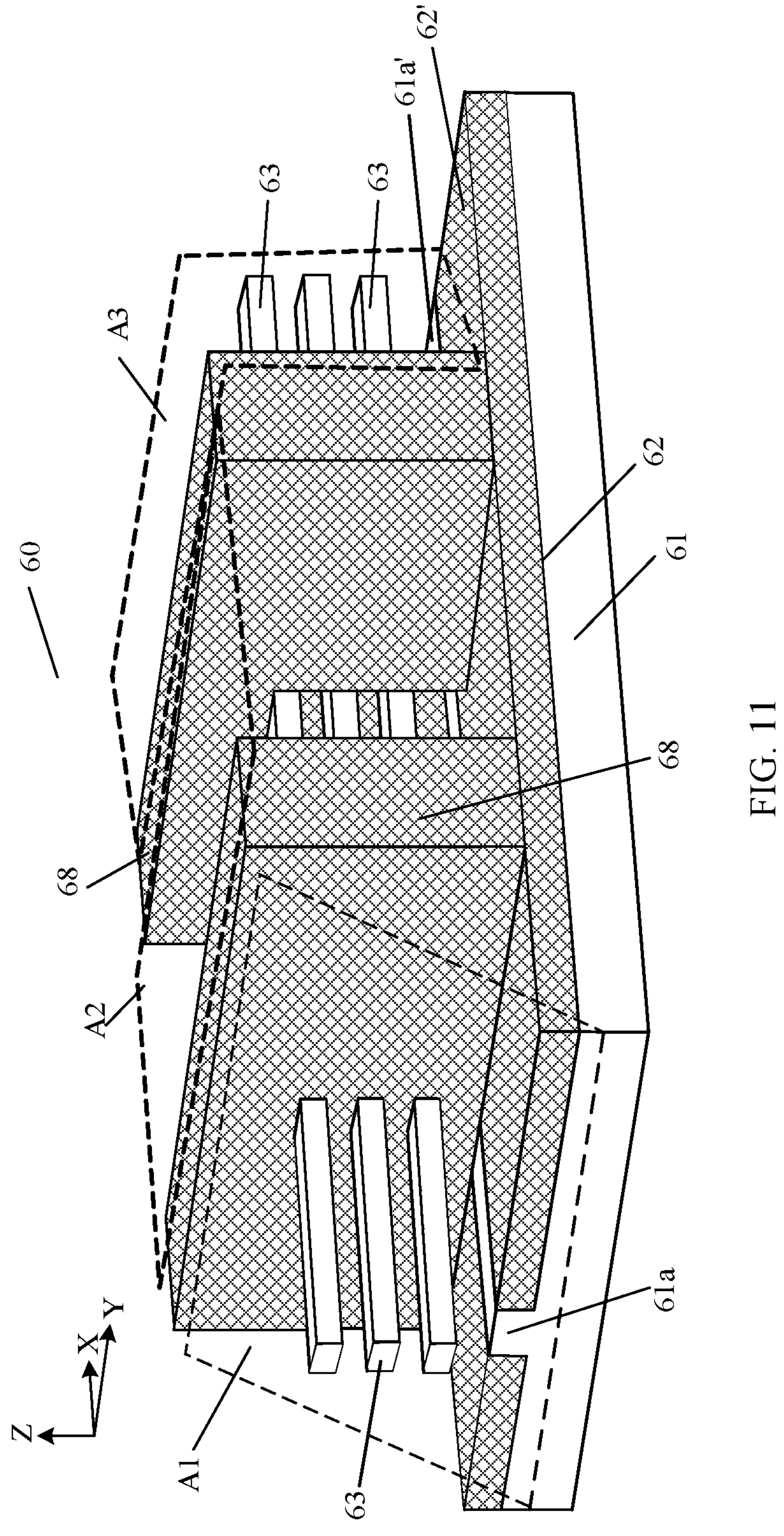
FIG. 11 is a schematic diagram of a structure of an exposed nanowire in a channel region according to an embodiment of this application.

In some possible implementations, refer to FIG. 11. FIG. 11 is a schematic diagram of a structure of the nanowire 63 exposed before the gate structure is disposed in the channel region A2. The nanowires 63 may have a same size. An orthographic projection of the nanowire 63 to the semiconductor protrusion 61*a* falls within an area covered by the surface 61*a*' of the semiconductor protrusion 61*a*. In other words, an orthographic projection of the nanowire 63 to the semiconductor protrusion 61*a* coincides with the surface 61*a*' of the semiconductor protrusion 61*a*.

In a specific process practice, before the gate material is deposited in the channel region A2, there is a gap between every two nanowires 63 and between the nanowire 63 closest to the semiconductor protrusion 61*a* and the semiconductor protrusion 61*a*. After the gate material is deposited in the channel region, the gap between every two nanowires 63 and the gap between the nanowire 63 and the semiconductor protrusion 61*a* are filled with the gate material, as shown in FIG. 10. Before the gap is formed, a semiconductor structure (which may be understood as a sacrificial layer (sacrifice)) is formed between every two nanowires 63 and between the nanowire 63 closest to the substrate 61 and the semiconductor protrusion 61*a*. A material used in the semiconductor structure is different from a semiconductor material used for forming the nanowire 63. For example, the semiconductor material for forming the nanowire 63 is SiGe, and the material for forming the semiconductor structure is Si. When the gate material is deposited in the channel region A2 shown in FIG. 6 after the semiconductor structure is etched, some of the gate material is deposited on the surface 61*a*' of the semiconductor protrusion 61*a*, in addition to filling between every two nanowires 63.

In some possible implementations, the gate structure 64 may be formed in the channel region A2, as shown in FIG. 6. The gate structure 64 wraps the portion of the nanowire 63 located in the channel region A2. Here, wrapping means that each side of the nanowire 63 extending in the first direction X is covered with the gate material, so that the GAA FET 60 forms a GAA structure.

For example, the gate structure 64 may include an N gate metal layer for forming an N-type field-effect transistor, or may include a P gate metal layer for forming a P-type field-effect transistor. A material of the N gate metal layer may include but is not limited to: titanium (Ti), silver (Ag), aluminum (Al), titanium aluminum nitrogen (TiAlN), tantalum carbon nitrogen (TaCN), tantalum silicon nitrogen (TaSiN), manganese (Mn), and the like. A material of the P gate metal layer may include but is not limited to: titanium nitrogen (TiN), tantalum nitrogen (TaN), ruthenium (Ru), molybdenum (Mo), aluminum (Al), tungsten nitride (WN), and the like.

Further, the oxide layer 65 (also referred to as a gate dielectric layer) is further formed between the gate structure 64 and each nanowire 63. The oxide layer 65 may isolate a channel from the substrate, and generate a floating body effect, so that a charge is stored in the channel, thereby implementing data storage. In a specific process, the oxide layer 65 is deposited on the semiconductor protrusion 61*a*, the insulation layer 62, and the nanowire 63 of the channel region A2 before the gate material is deposited in the channel region A2. The oxide layer 65 wraps the nanowire 63 and fills the gap between every two nanowires 63 and between the nanowire 63 and the semiconductor protrusions 61*a*. The oxide layer 65 may be a high dielectric constant (HK, High-K) dielectric layer, and a specific material of the oxide layer 65 may include but is not limited to: LaO, AlO, ZrO, TiO, SiO and another material. The gate structure 64 (that is, a gate metal layer) is deposited on the oxide layer 65.

In some possible implementations, still referring to FIG. 6, the GAA FET 60 may further include a plurality of insulation structures 68. The plurality of insulation structures 68 may be disposed between the source region A1 and the channel region A2, and between the channel region A2 and the drain region A3. The insulation structure 68 in the GAA FET 60 is deposited on the insulation layer 62, the semiconductor protrusion 61*a*, and the nanowire 63. The insulation structure 68 spans the semiconductor protrusion 61 and the nanowire 63 in the second direction Y. As can be seen from FIG. 6, in the third direction Z, a height of the insulation structure 68 is greater than a height of a stack of the nanowires 63. A material for forming the insulation structure 68 may include but is not limited to: silicon oxide, silicon nitride, silicon carbide, silicon oxynitride or any combination thereof. In addition, the insulation structure 68 may alternatively be a structure formed by a plurality of material layers. For example, in the insulation structure 68, a silicon oxide layer is formed on a side close to the channel region, and a silicon nitride layer is formed on a side away from the channel region. This is not specifically limited in this embodiment of this application. Further, a top surface of the gate structure 64 is flush with a top surface of the insulation structure 68, as shown in FIG. 9.

In this embodiment of this application, the source structure and the drain structure may be formed by epitaxially growing a semiconductor material on the nanowire 63 located in the source region A1 and the drain region A3. For example, the semiconductor material may be a single-element semiconductor material such as germanium (Ge) or Si, or may be a mixed semiconductor material of germanium and silicon, or may be a compound semiconductor material such as GaAs, aluminum gallium arsenide (AlGaAs), or may be a semiconductor alloy such as SiGe, gallium arsenide phosphide (GaAsP). When epitaxially growing the semiconductor material, the source structure and the drain structure may be formed in an in-situ doping manner. For example, boron ions may be in-situ doped to form a P-type GAA FET, or phosphorus ions or arsenic ions may be in-situ doped to form an N-type GAA FET. A semiconductor structure 66 formed of a semiconductor material epitaxially grown on the nanowire 63 located in the source region A1 and the drain region A3 is shown in FIG. 9.

Further, referring to FIG. 9, the GAA FET 60 further includes a contact metal 69, and a contact metal 67 is deposited on the epitaxially grown semiconductor structure 66. The contact metal 69 is used for leading out the source and drain. As shown in FIG. 9, the contact metal 67 is in contact with the semiconductor structure 66 (for example, wrapping a top surface of the semiconductor structure 66) at bottom, and a top surface of the contact metal 67 is flush with the insulation layer 62. A contact metal 69 is in contact with the gate structure 64 through a via provided in the insulation layer 62 to lead out the gate. Materials of the contact metal 67 and the contact metal 69 may include, for example, but are not limited to: metallic copper, nickel, aluminum or alloys formed by any combination thereof.

Figure 12:
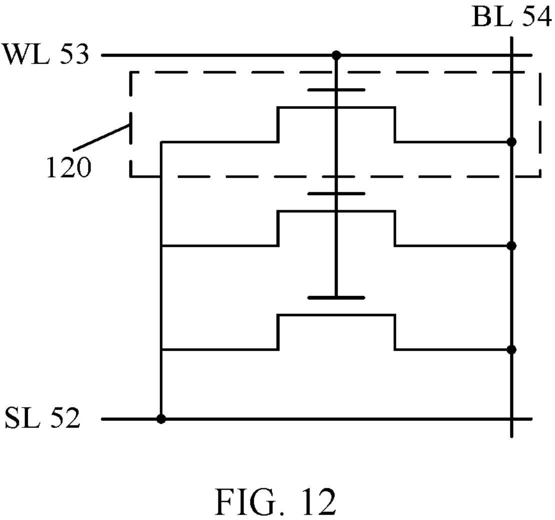
FIG. 12 is a schematic diagram of a circuit structure of a GAA FET according to an embodiment of this application.

In some possible implementations, the GAA FET may be equivalent to a plurality of field-effect transistors connected in parallel. Each nanowire forms a field-effect transistor with a source structure, a drain structure, a gate structure, and the like. For example, it is assumed that, as shown in FIG. 12, the GAA FET 60 includes three nanowires. In this case, the GAA FET 60 may be equivalent to three field-effect transistors 120 connected in parallel, and the three field-effect transistors 120 share an SL52, a WL53, and a BL54. In this way, a magnitude of a current on the BL54 is increased, and a storage status of the GAA FET is detected more easily.

It can be learned from the foregoing description that for a next-generation logic process (for example, GAA), a storage array including a GAA FET (that is, GAA) manufactured by using a same process as a logic process is used in a memory, so that the memory can be compatible with the logic process. Further, the GAA FET has a three-dimensional structure, and therefore high capacity storage of the memory can be implemented. Further, because a channel in the GAA FET uses SiGe, the GAA FET is more likely to have band to band tunneling occurred. This is more conducive to maintaining and distinguishing a storage status.

Based on a same concept, an embodiment of this application further provides an electronic device. The electronic device includes the memory shown in the foregoing embodiments. Specifically, the electronic device may be an unpackaged die, or may be an electronic component. The memory shown in this embodiment of this application may be packaged in a shell. The shell may include but is not limited to a plastic shell, a metal shell (for example, a gold shell or a nickel shell), and the like. A source, a drain, and a gate of a GAA FET are led out from an outer surface of the shell. In addition, the electronic device may alternatively be an integrated circuit product (for example, a system on chip (SOC)). In addition to the memory described in this embodiment of this application, the integrated circuit product may further include a logic device formed by a GAA FET. The logic device may be coupled to the memory through, for example, an on-chip high-speed bus interface. In this way, a transmission distance of a read/write data signal within a chip is short, and a system delay is very low. Further, the logic device and the memory are integrated on a same die, so that the logic device and the memory are packaged in a SOC.

For example, the logic device may be a general-purpose CPU, a graphics processing unit (GPU), a microprocessor, an application-specific integrated circuit (ASIC), a field-programmable gate array (FPGA), or the like.

In this embodiment of this application, the logic device is manufactured by using a logic process (for example, a GAA process). The logic device includes a plurality of GAA FETs, and a nanowire in each GAA FETs may be made of a Si material. It is different from the material (that is, SiGe) of the nanowire in the GAA FET in the memory. In this way, the logic device has characteristics, low leakage current and low power consumption, while the memory is more likely to have a band to band tunneling phenomenon, and has better storage performance.

Further, a quantity of nanowires of the GAA FET in the logic device may be greater than a quantity of nanowires of the GAA FET in the memory. That is, a quantity of channels in each GAA FET in the logic device is greater than a quantity of channels in each GAA FET in the memory. Alternatively, a quantity of nanowires of the GAA FET in the logic device may be less than a quantity of nanowires of the GAA FET in the memory. That is, a quantity of channels in each GAA FET in the logic device is less than a quantity of channels in each GAA FET in the memory. It can be understood that for a GAA FET, the fewer channels, the lower power consumption; while the more channels, the higher a read/write speed, and the longer data storage time.

Based on a same concept, and based on the foregoing structure of the GAA FETs, an embodiment of this application further provides a method for manufacturing a GAA FET. A process flow of manufacturing a GAA FET is described in detail below, by using a structure of a manufactured GAA FET shown in FIG. 9 as an example and with reference to a process flow 1300 shown in FIG. 13. The process flow 1300 includes the following steps.

S1301: Provide a substrate, and form a semiconductor protrusion on the substrate.

The substrate may be a semiconductor material, and the semiconductor material may specifically include but is not limited to: Si, GaN, GaAs, AlN, SiC, InP, ZnSe or another Group VI, Group III-V or Group II-VI semiconductor material.

In a specific process, a patterned mask layer may be formed on a substrate 61, the substrate 61 is etched by using the patterned mask layer as a mask, and a portion unetched forms a semiconductor protrusion 61*a*, as shown in FIG. 7. Specifically, various etching methods such as dry etching or wet etching may be used to etch the substrate 61 to form the semiconductor protrusion 61*a*.

Figures 14A, 14B:
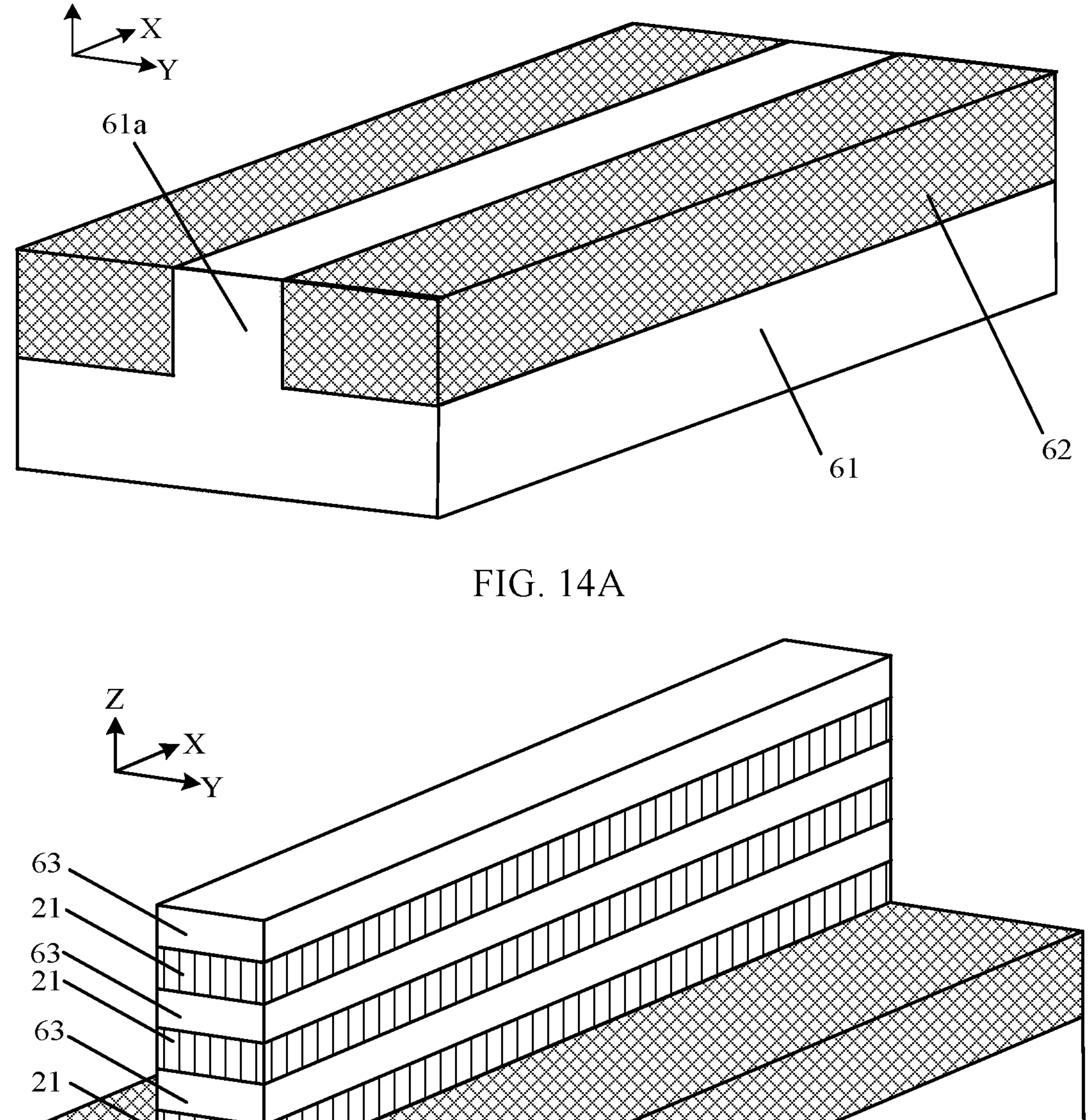
FIG. 14A to FIG. 14H are schematic diagrams of structures of a GAA FET in a manufacturing process according to an embodiment of this application.

Next, an insulation material is deposited on portions of the substrate 61 located on both sides of the semiconductor protrusion 61*a* to form an insulation layer 62, as shown in FIG. 14A.

Specifically, a thickness in the third direction Z of the insulation material deposited on both sides of the semiconductor protrusion 61*a* is equal to a height of the semiconductor protrusion 61 protruding outward from the substrate 61.

S1302: Alternately deposit SiGe (that is, a first semiconductor material) and Si (a second semiconductor material) on a semiconductor protrusion.

Through the step 1302, a structure in which a semiconductor structure 21 (formed of the second semiconductor material) and a nanowire 63 (formed of the first semiconductor material) are sequentially stacked may be formed, as shown in FIG. 14B.

S1303: Form a dummy gate structure and an insulation structure on the semiconductor protrusion, a semiconductor structure, and an insulation layer.

Specifically, a semiconductor material such as polysilicon may be deposited in the middle of the semiconductor protrusion 61*a* and the semiconductor structure 21 and the nanowire 63 sequentially stacked to form a dummy gate structure 22. It should be noted that because a metal gate needs to be deposited after etching the polysilicon material, a gate formed by the deposited polysilicon material is referred to as a dummy gate herein.

Figure 14C:
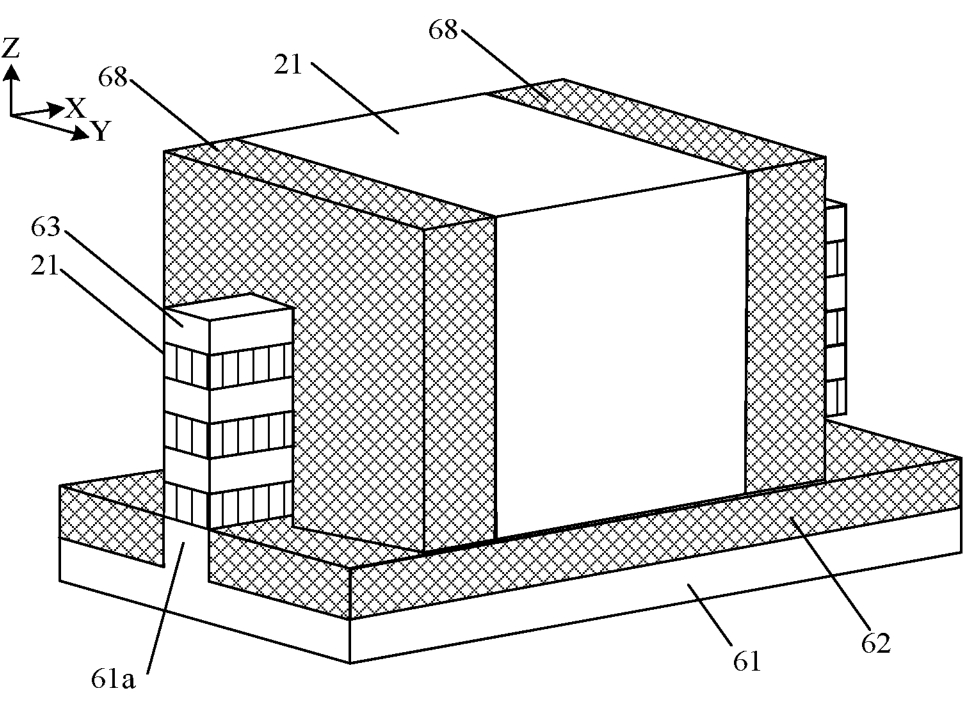

Next, an insulation structure 68 is formed on a side wall of the dummy gate structure 22. A material of the insulation structure 68 may include but is not limited to: silicon nitride, silicon carbide, silicon oxynitride, and the like. The insulation structure 68 may be formed by a dielectric deposition and etching process. The insulation structure 68 may include two portions spanning the semiconductor protrusions 61*a* and the semiconductor structure 21 and the nanowire 63 sequentially stacked. One portion is used to block a source region A1 in which a source is formed and the dummy gate structure 22, and the other portion is used to block a drain region A2 in which a drain is formed and the dummy gate structure 22, as shown in FIG. 14C.

S1304: Grow a semiconductor structure on the semiconductor protrusion and an exposed portion of a nanowire.

Figure 14D:
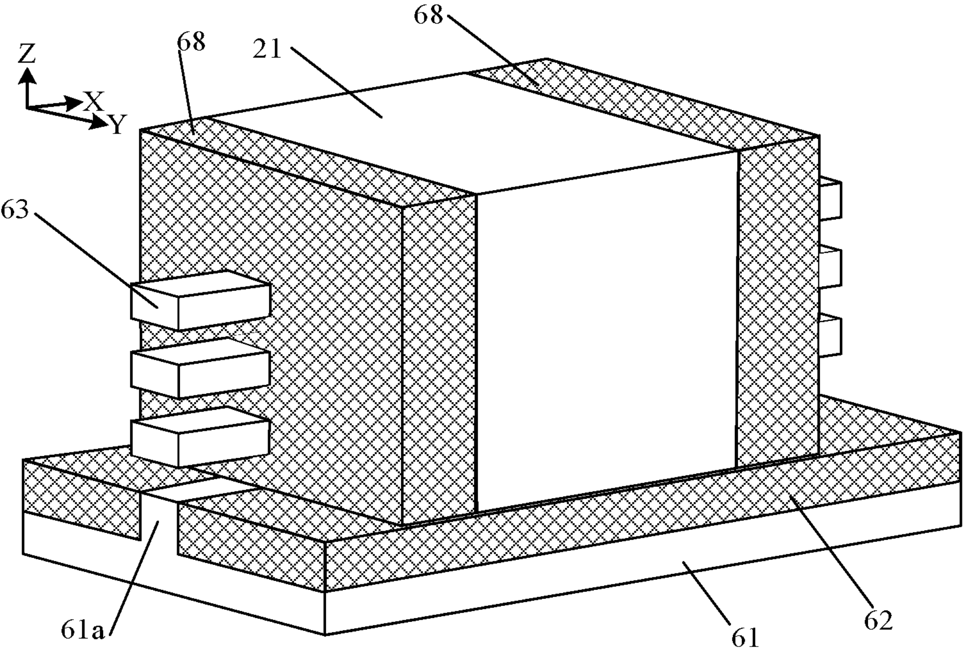

Specifically, after forming the dummy gate structure 22 and the insulation structure 68, the exposed semiconductor structure 21 may be etched, so that there is a gap between every two exposed nanowires 63 for growing a semiconductor material, as shown in FIG. 14D. Next, an internal insulation material is provided on the left and right, in the second direction Y, of portions of the semiconductor structure 21 and the nanowire 63 that are wrapped by the insulation structure 68. During actual application, exposed portions except the substrate 61 may be covered with an insulation material, so that the insulation material flows through a gap between every two nanowires 63 into the portion wrapped by the insulation structure 68. Next, the insulation material covering the nanowire 63 is etched, so that the semiconductor structure 21 and the nanowire 63 wrapped by the insulation material form the insulation structure 68.

Figure 14E:
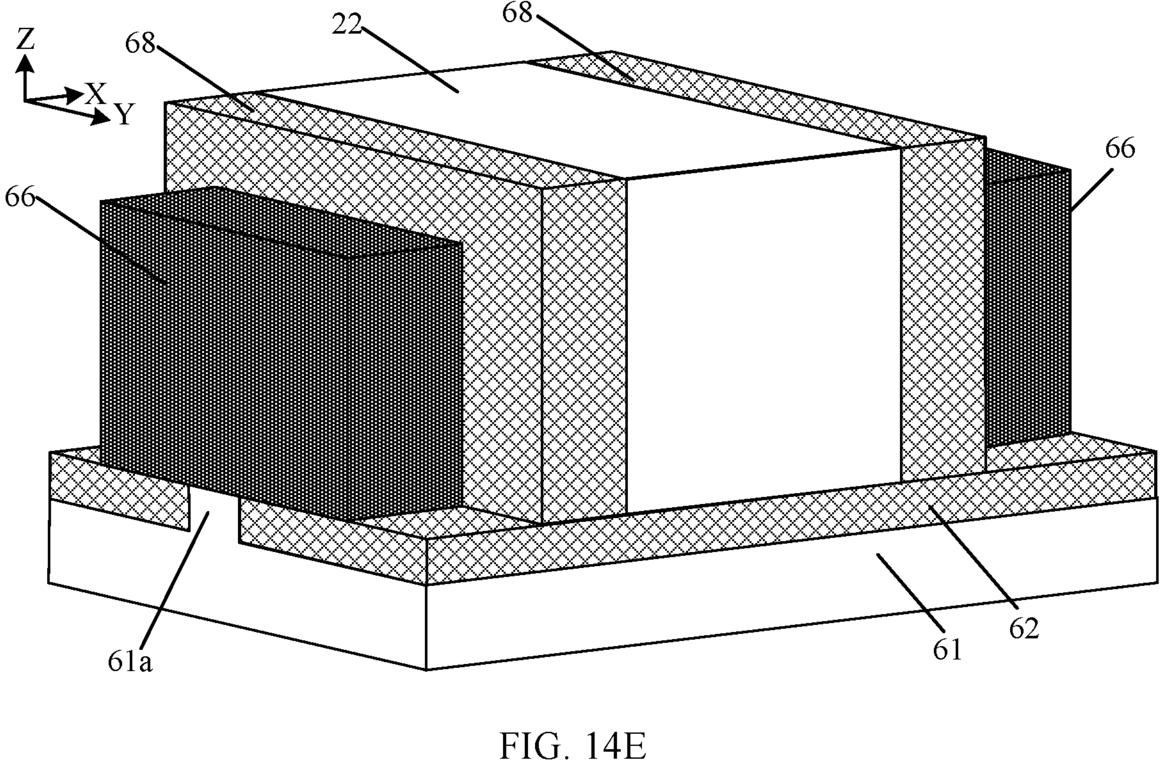

Finally, a semiconductor material is grown on the exposed semiconductor protrusion 61*a* and nanowire 63 to form a semiconductor structure 66. The formed semiconductor structure 66 is shown in FIG. 14E. For example, the semiconductor material may be a single-element semiconductor material such as Ge or Si, or may be a compound semiconductor material such as GaAs, AlGaAs, or may be a semiconductor alloy such as SiGe, GaAsP.

In some possible implementations, the semiconductor material may be grown through an in-situ doping method, and then high-temperature annealing is performed on the semiconductor material to form the semiconductor structure 66.

In some other possible implementations, the semiconductor material may be first grown in an undoped manner, and then ions are implanted into the semiconductor material through an ion implantation method. After the semiconductor material is doped with ions, high-temperature annealing is performed on the semiconductor material to form the semiconductor structure 66.

When the formed GAA FET device is P-type, the doped ions may be trivalent ions, for example, boron ions. When the formed GAA FET device is N-type, the doped ions may be pentavalent ions, for example, phosphorus ions.

S1305: Separately deposit an insulation material in a source region and a drain region, to form an insulation structure.

Specifically, the insulation material may include but is not limited to: a material such as silicon oxide or nitrogen oxide. The insulation material may be deposited by techniques such as chemical vapor deposition (CVD), physical vapor deposition (PVD), atomic layer deposition (ALD), and the like.

Figure 14F:
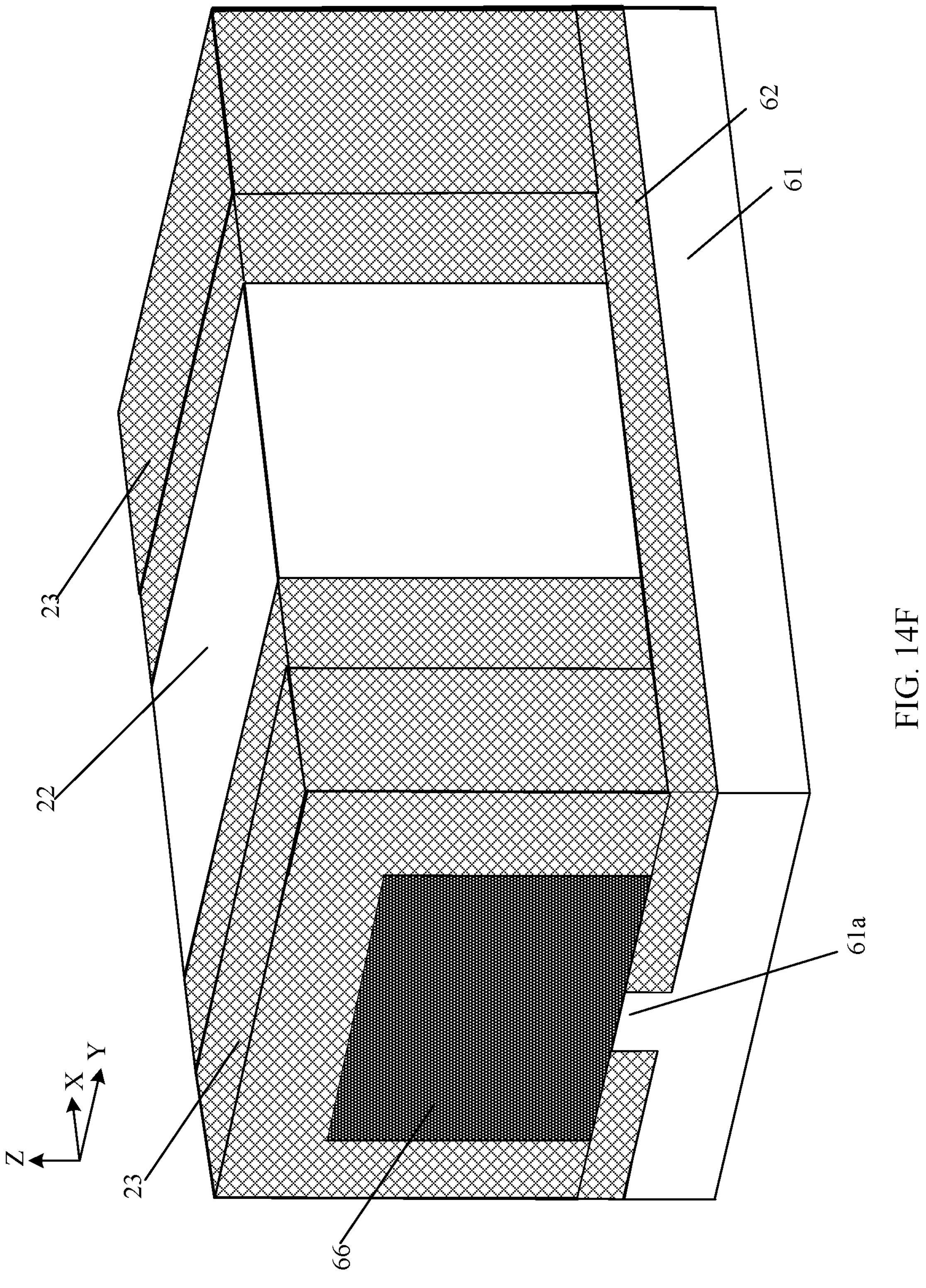

Further, Excess insulation material may be removed by a chemical mechanical polishing (CMP) process to form an insulation structure 23. The insulation structure 23 is flush with a surface of the dummy gate structure 22 away from the substrate, as shown in FIG. 14F. The insulation structure 23 is deposited around the epitaxially grown semiconductor structure 66 to protect the semiconductor structure 66. In addition, an exposed outer surface of the dummy gate structure 22 is also covered with an insulation material, so as to form an insulation layer 24 shown in FIG. 9 to protect the dummy gate structure 22. The insulation layer 24 may be the same as the insulation material of which the insulation structure 23 is formed. In the third direction Z, a bottom surface of the insulation structure 23 is in contact with the insulation layer 62.

S1306: Etch the dummy gate structure to expose the nanowire and semiconductor structure located in a channel region.

A patterned mask layer is formed on the insulation structure 23 and the dummy gate structure 22, and the dummy gate structure 22 shown in FIG. 14F is etched to expose the nanowire 63 and the semiconductor structure 21 located in the channel region. Further, after etching the dummy gate structure 22, the insulation layer 62 at the bottom is exposed.

S1307: Etch the semiconductor structure (that is, a sacrificial layer formed by using Si) in the channel region, so that there is a gap between nanowires.

S1308: Etch an exposed nanowire, to reduce a thickness of a portion of the nanowire located in the channel region.

Figure 14G:
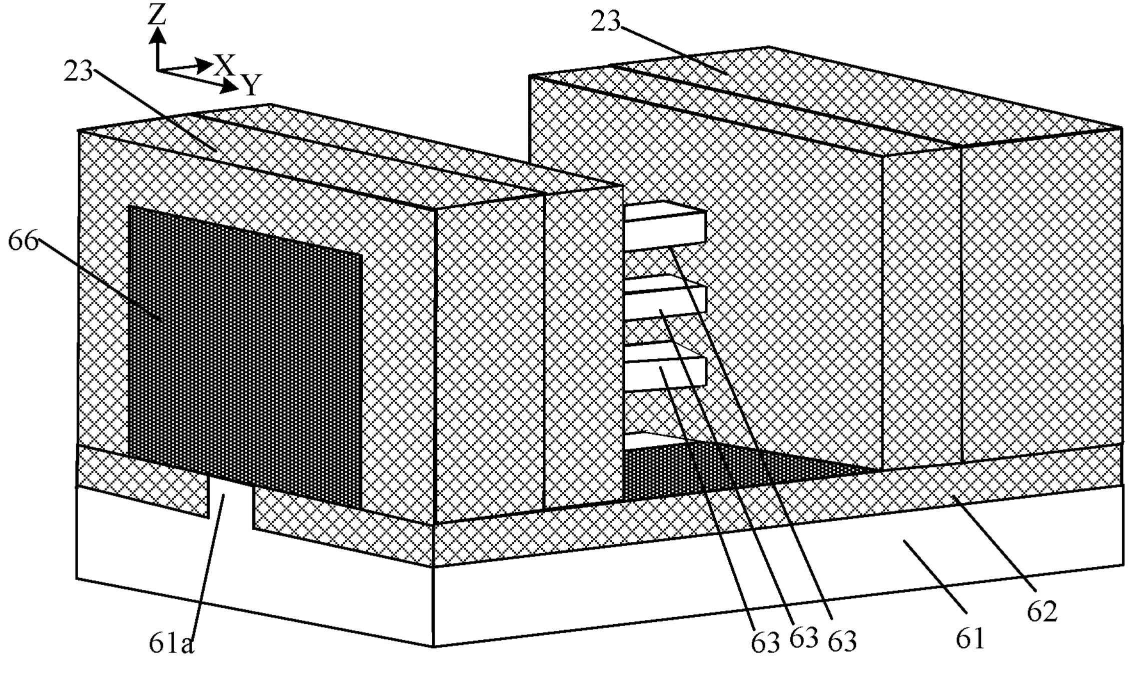

In a specific process, a patterned mask layer may be formed on an exposed portion of the nanowire 63, and the nanowire 63 is etched through a method such as dry etching and wet etching. A structure after etching the nanowire 63 located in the channel region is shown in FIG. 14G.

In this embodiment of this application, the nanowire 63 is not completely etched, and an objective of etching is to reduce a thickness of the nanowire 63 in the third direction Z. Therefore, in a specific implementation process, the nanowire 63 may be etched through an atomic layer etching (ALE) method. In this way, an amount by which the nanowire 63 is etched can be precisely controlled, so that the thickness of the nanowire 63 in the third direction Z can be reduced while an amount by which the nanowire 63 is etched in the second direction Y can be reduced.

S1309: Form a gate structure in the channel region.

In a specific process, a HK dielectric layer may be deposited in the channel region first. A specific material of the HK dielectric layer may include but is not limited to: LaO, ALO, ZrO, TiO, SiO and another material.

Figure 14H:
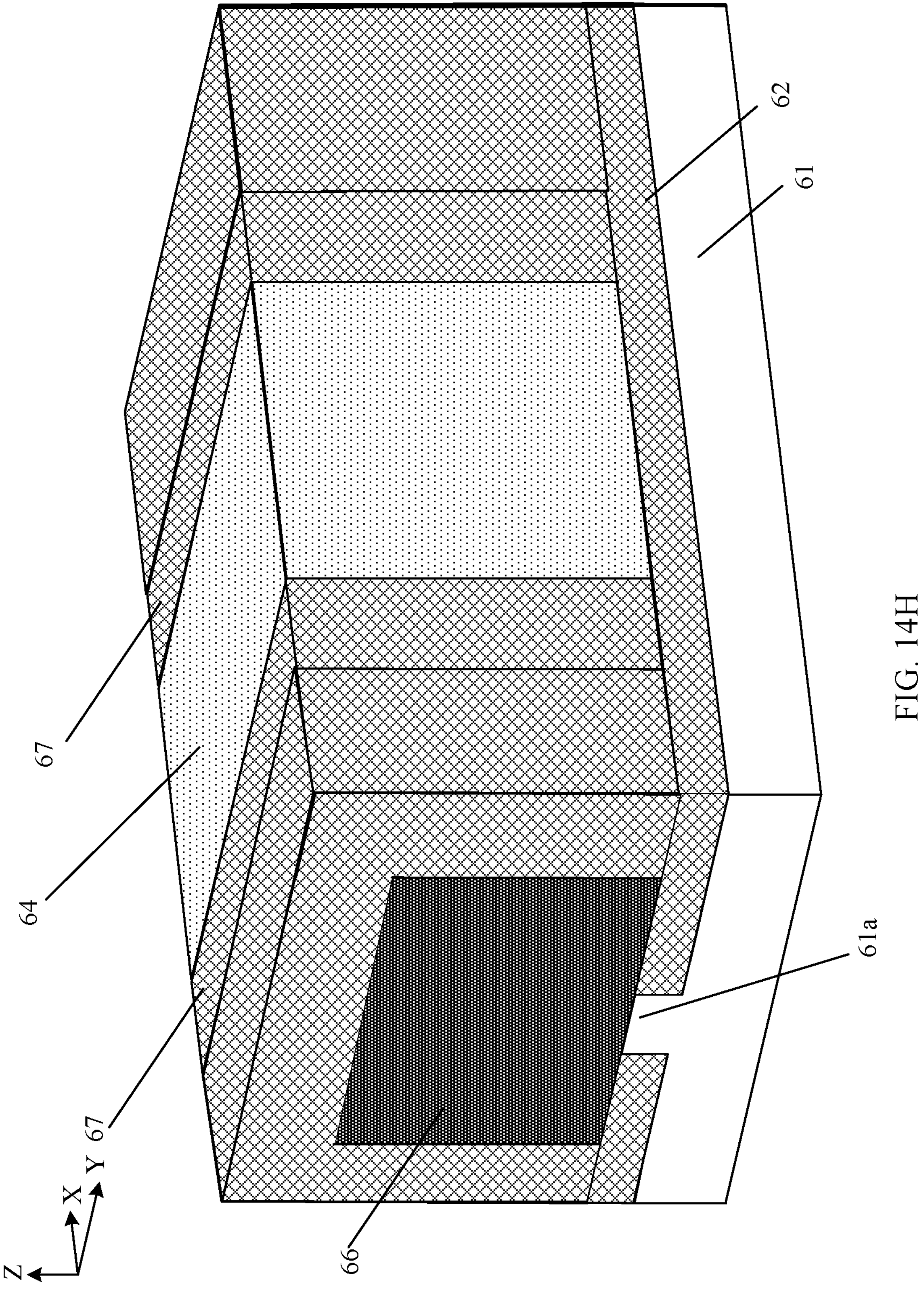

Next, a metal is deposited on the HK dielectric layer through PVD, CVD, or the like, and excess metal material is removed through a CMP process, so that the metal is flush with a surface of the insulation structure 68 away from the substrate, thereby forming a gate structure 64, as shown in FIG. 14H. The metal material may include an N gate metal material for forming an N-type field-effect transistor, or may include a P gate metal material for forming a P-type field-effect transistor. The N gate metal material may include but is not limited to: Ti, Ag, Al, TiAlN, TaCN, TaSiN, Mn, and the like. The P gate metal material may include but is not limited to: TiN, TaN, Ru, Mo, Al, WN, and the like.

S1310: Etch the insulation structure, deposit a metal material, and form a contact metal to lead out a source and a drain.

The insulation structure 23 on the semiconductor structure 66 is etched to expose an upper surface of the semiconductor structure 66 away from the substrate.

A metal material is then deposited on the exposed semiconductor structure 66, and excess metal material is removed through a CMP process to form a contact metal 67. A surface of the contact metal 67 that is not in contact with the semiconductor structure 66 may be flush with the insulation structure 23.

S1311: Cover an exposed surface of the gate structure with an insulation material, to form an insulation layer.

An insulation material is deposited on the exposed surface of the gate structure 64, and the insulation material completely covers the surface of the gate structure 64 to form the insulation layer 24, thereby protecting the gate structure 64.

S1312: Etch an insulation layer to lead out a gate.

The insulation layer 24 covering the gate structure 64 is etched to form a via that penetrates upper and lower surfaces of the insulation layer 24. A metal material is deposited on a surface of the insulation layer 24 away from the gate structure 64 and in the via of the insulation layer 24, to form a contact metal. A contact metal 70 is in contact with the gate structure 64 through the via provided in the insulation layer 24 to lead out a gate.

After S1301 to S1312, a GAA FET is manufactured as shown in FIG. 9.

Figure 13:
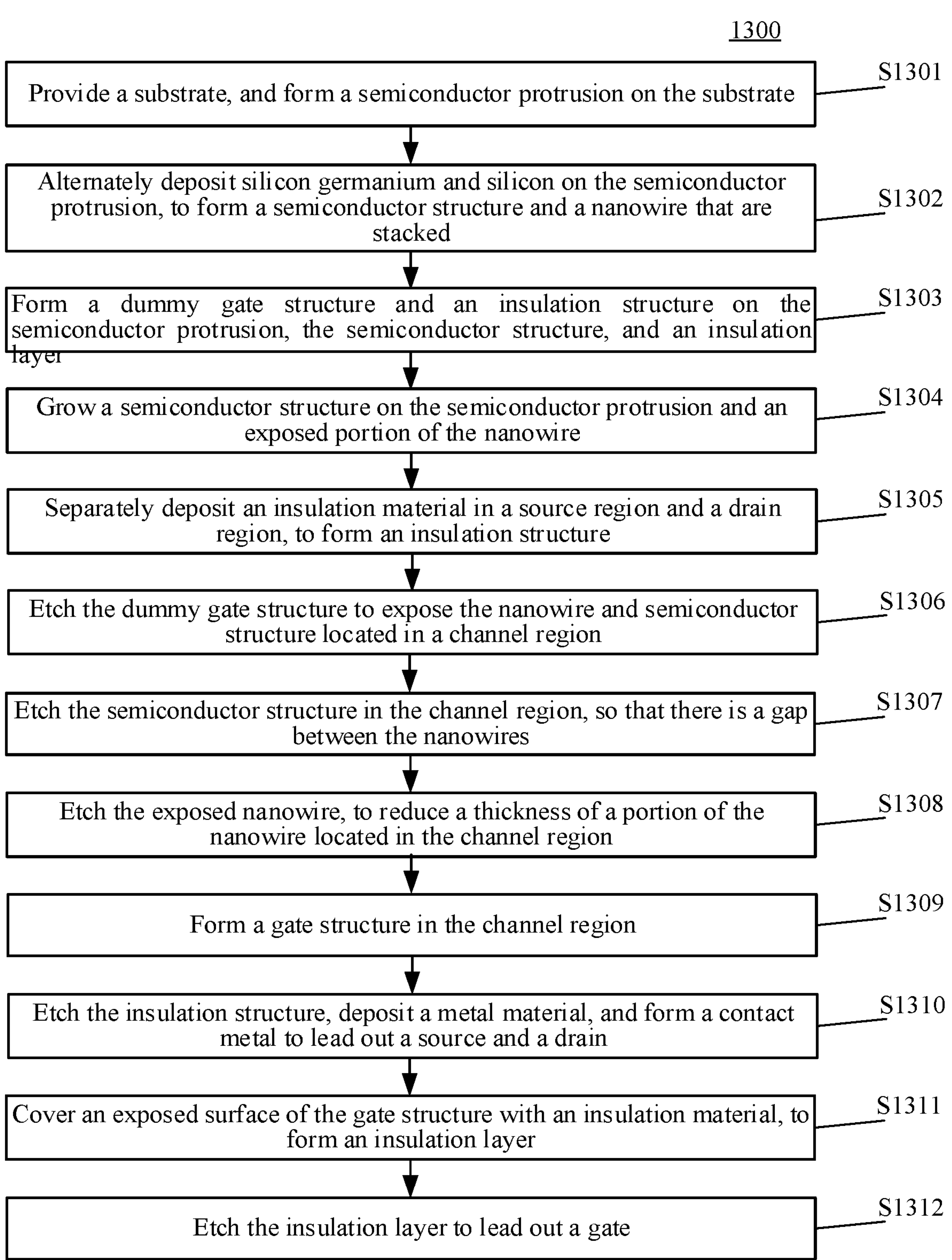
FIG. 13 is a flowchart of a GAA FET manufacturing method according to an embodiment of this application.

It should be noted that a GAA FET manufactured through the process flow 1300 shown in FIG. 13 may be applied to the memory described in the foregoing embodiment, and may be further applied to a component such as an IO, so as to improve a switching speed. In another implementation, a manufactured GAA FET may be further applied to a component, for example, a processor core, and a process step shown in step 1308 may be omitted, to simplify the process flow.

In the foregoing embodiments, descriptions of all embodiments have respective focuses. For a part that is not described in detail in an embodiment, refer to related descriptions in other embodiments.

The foregoing descriptions are merely specific implementations examples of this application, and are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A memory comprising:

a storage array comprising a plurality of gate-all-around field-effect transistors, wherein each gate-all-around field-effect transistor comprises:
- a substrate comprising a substrate protrusion, wherein the substrate protrusion comprises a protrusion surface;
- an insulation layer formed on the substrate and not formed on the protrusion surface;
- a source;
- a drain;
- a gate; and
- a nanowire made of silicon germanium (SiGe), wherein the nanowire is disposed on a side of the insulation layer away from the substrate, wherein the nanowire is positioned parallel to the substrate protrusion, and wherein the nanowire is aligned with the protrusion surface;

at least one source line connected to sources of the gate-all-around field-effect transistors;

at least one word line connected to gates of the gate-all-around field-effect transistors; and at least one bit line connected to drains of the gate-all-around field-effect transistors, wherein a first group of the gate-all-around field-effect transistors located in a same row in the storage array share one word line of the at least one word line and share one source line of the at least one source line, and wherein a second group of the gate-all-around field-effect transistors located in a same column in the storage array share one bit line of the at least one bit line.

2. The memory of claim 1, wherein each gate-all-around field-effect transistor further comprises:

a gate structure encompassing the nanowire; and an oxide layer formed between the gate structure and the nanowire.

3. The memory of claim 1, wherein each gate-all-around field-effect transistor further comprises a source region, a drain region, and a channel region, and wherein the nanowire extends in a length direction and penetrates the source region, the drain region, and the channel region.

4. The memory of claim 3, wherein the source is formed in the source region, and wherein the drain is formed in the drain region.

5. The memory of claim 3, wherein each the gate-all-around field-effect transistor further comprises:

a first insulation structure disposed between the source region and the channel region; and a second insulation structure disposed between the channel region and the drain region.

6. The memory of claim 5, wherein each of the first insulation structure and the second insulation structure spans the nanowire.

7. The memory of claim 5, wherein the first insulation structure comprises:

a first material layer formed on a first side close to the channel region; and a second material layer formed on a second side away from the channel region, wherein the first material layer is different than the second material layer, and wherein the second insulation structure comprises:

the first material layer formed on a third side close to the channel region; and the second material layer formed on a fourth side away from the channel region.

8. The memory of claim 1, wherein the memory is a dynamic random-access memory (DRAM).

9. An electronic device, comprising:

a memory comprising:

a storage array comprising a plurality of first gate-all-around field-effect transistors wherein each first gate-all-around field-effect transistor comprises:

a substrate comprising a substrate protrusion, wherein the substrate protrusion comprises a protrusion surface;

an insulation layer formed on the substrate and not formed on the protrusion surface;

a source;

a drain;

a gate; and a nanowire disposed on a side of the insulation layer away from the substrate, wherein a material of the nanowire is silicon germanium (SiGe), wherein the nanowire is positioned parallel to the substrate protrusion, and wherein the nanowire is aligned with the protrusion surface;

at least one source line connected to sources of the first gate-all-around field-effect transistors;

at least one word line connected to gates of the first gate-all-around field-effect transistors; and at least one bit line connected to drains of the first gate-all-around field-effect transistors, wherein a first group of the gate-all-around field-effect transistors located in a same row in the storage array share one word line of the at least one word line and share one source line of the at least one source line, and wherein a second group of the gate-all-around field-effect transistors located in a same column in the storage array share one bit line of the at least one bit line; and a logic device coupled to the memory and comprising a second gate-all-around field-effect transistor.

10. The electronic device of claim 9, wherein the second gate-all-around field-effect transistor comprises a second nanowire made of silicon (Si).

11. The electronic device of claim 9, wherein a second quantity of nanowires of the second gate-all-around field-effect transistor is greater than a first quantity of nanowires of the first gate-all-around field-effect transistor.

12. The electronic device of claim 9, further comprising a die, wherein the die comprises the logic device and the memory.

13. The electronic device of claim 9, wherein the first gate-all-around field-effect transistor further comprises:

a gate structure encompassing the nanowire; and an oxide layer formed between the gate structure and the nanowire.

14. The electronic device of claim 13, wherein the first gate-all-around field-effect transistor further comprises a source region, a drain region, and a channel region, and wherein the nanowire extends in a length direction and penetrates the source region, the drain region, and the channel region.

15. The electronic device of claim 14, wherein the first gate-all-around field-effect transistor further comprises:

a first insulation structure disposed between the source region and the channel region, wherein the first insulation structure comprises:

a first material layer formed on a first side close to the channel region; and a second material layer formed on a second side away from the channel region, wherein the first material layer is different than the second material layer; and a second insulation structure disposed between the channel region and the drain region, wherein the second insulation structure comprises:

the first material layer formed on a third side close to the channel region; and the second material layer formed on a fourth side away from the channel region.

16. The electronic device of claim 9, wherein a second quantity of nanowires of the second gate-all-around field-effect transistor is less than a first quantity of nanowires of the first gate-all-around field-effect transistor.

17. A gate-all-around field-effect transistor, comprising:

a substrate comprising a substrate protrusion, wherein the substrate protrusion comprises a protrusion surface;

an insulation layer formed on the substrate and not formed on the protrusion surface;

a nanowire disposed on a side of the insulation layer away from the substrate, wherein a material of the nanowire is silicon-germanium (SiGe), wherein the nanowire is positioned parallel to the substrate protrusion, and wherein the nanowire is aligned with the protrusion surface;

a gate structure encompassing the nanowire;

an oxide layer formed between the gate structure and the nanowire;

a source region;

a drain region;

a channel region, wherein the nanowire extends in a first direction and penetrates the source region, the drain region, and the channel region;

a first insulation structure disposed between the source region and the channel region, wherein the first insulation structure comprises:

a first material layer formed on a first side close to the channel region; and a second material layer formed on a second side away from the channel region, wherein the first material layer is different than the second material layer; and a second insulation structure disposed between the channel region and the drain region, wherein the second insulation structure comprises:

the first material layer formed on a third side close to the channel region; and the second material layer formed on a fourth side away from the channel region.

18. The gate-all-around field-effect transistor of claim 17, further comprising:

a source structure formed in the source region; and a drain structure formed in the drain region.

19. The gate-all-around field-effect transistor of claim 17, wherein each of the first insulation structure and the second insulation structure spans the nanowire.

20. The gate-all-around field-effect transistor of claim 17, wherein the first material layer is a silicon oxide layer, and wherein the second material layer is a silicon nitride layer.

* * * * *